(12) United States Patent
Park

(10) Patent No.: US 8,269,281 B2
(45) Date of Patent: Sep. 18, 2012

(54) METHOD FOR FORMING GATE OXIDE OF SEMICONDUCTOR DEVICE

(75) Inventor: Jung Goo Park, Daejeon (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 12/947,526

(22) Filed: Nov. 16, 2010

(65) Prior Publication Data

US 2011/0057252 A1    Mar. 10, 2011

Related U.S. Application Data

(63) Continuation of application No. 12/318,392, filed on Dec. 29, 2008, now Pat. No. 7,892,960.

(30) Foreign Application Priority Data

Dec. 28, 2007    (KR) .......................... 10-2007-0140369

(51) Int. Cl.
*H01L 29/66* (2006.01)
*H01L 21/02* (2006.01)

(52) U.S. Cl. .......................... 257/365; 257/410; 257/411

(58) Field of Classification Search .................. 257/410, 257/411, 369, E21.179; 438/199, 260, 218, 438/761

See application file for complete search history.

(56) References Cited

U.S. PATENT DOCUMENTS

| | | | | |
|---|---|---|---|---|
| 5,888,869 A | * | 3/1999 | Cho et al. ................... | 438/258 |
| 7,138,691 B2 | | 11/2006 | Burnham et al. ........... | 257/410 |
| 7,179,750 B2 | | 2/2007 | Kim et al. ................... | 438/723 |
| 7,323,420 B2 | | 1/2008 | Kim et al. ................... | 438/723 |
| 2001/0004120 A1 | * | 6/2001 | Colclaser et al. ........... | 257/326 |
| 2001/0039093 A1 | * | 11/2001 | Oohashi ...................... | 438/275 |
| 2003/0211692 A1 | * | 11/2003 | Lee ............................... | 438/258 |
| 2003/0232491 A1 | * | 12/2003 | Yamaguchi ................ | 257/411 |
| 2006/0208303 A1 | * | 9/2006 | Kim et al. ................... | 257/314 |
| 2006/0281265 A1 | | 12/2006 | Burnham et al. ........... | 438/287 |
| 2007/0138571 A1 | * | 6/2007 | Nakabayashi et al. ..... | 257/371 |

FOREIGN PATENT DOCUMENTS

| | | |
|---|---|---|
| JP | 2005-210123 | 8/2005 |
| JP | 2006-080309 | 3/2006 |
| KR | 2004-0038546 | 5/2004 |

* cited by examiner

*Primary Examiner* — Scott B Geyer
(74) *Attorney, Agent, or Firm* — NSIP Law

(57) ABSTRACT

Disclosed herein is a method for forming a triple gate oxide of a semiconductor device. The method for forming a triple gate oxide of a semiconductor device includes the steps of defining a first region where a gate oxide having a first thickness will be formed, a second region where a gate oxide having a second thickness will be formed and a third region where a gate oxide having a third thickness will be formed on a semiconductor substrate, forming a first oxide film through wet oxidation on the semiconductor substrate and forming a second oxide film on the first oxide film, blocking the first region and selectively removing portions the second oxide film and the first oxide film, which are formed on the second region and the third region, forming a third oxide film through thermal oxidation on the semiconductor substrate, blocking the first region and the second region and selectively removing a portion of the third oxide film, which is formed on the third region, and forming a fourth oxide film through thermal oxidation on the semiconductor substrate and then forming a nitride film thereon, wherein a gate oxide having a triple structure of the first oxide film/second oxide film/nitride film is formed in the first region, a gate oxide having a double structure of the third oxide film/nitride film is formed in the second region and a gate oxide having a double structure of the fourth oxide film/nitrate film is formed in the third region.

14 Claims, 6 Drawing Sheets

【Fig. 1a】
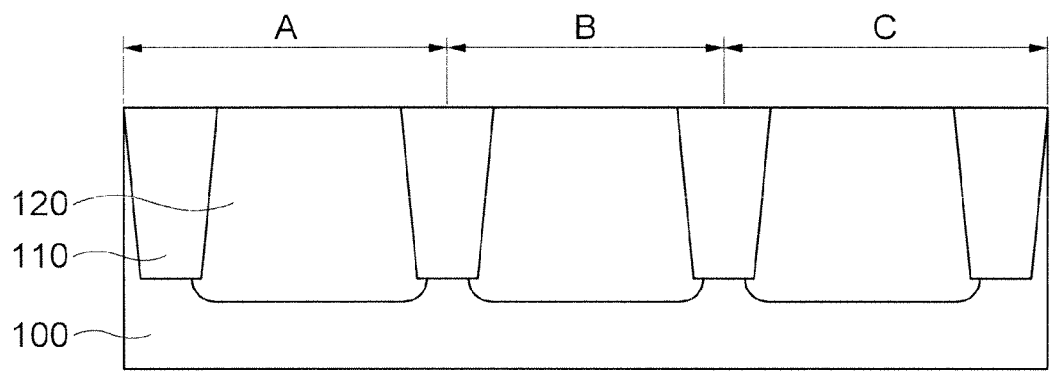
【Fig. 1b】
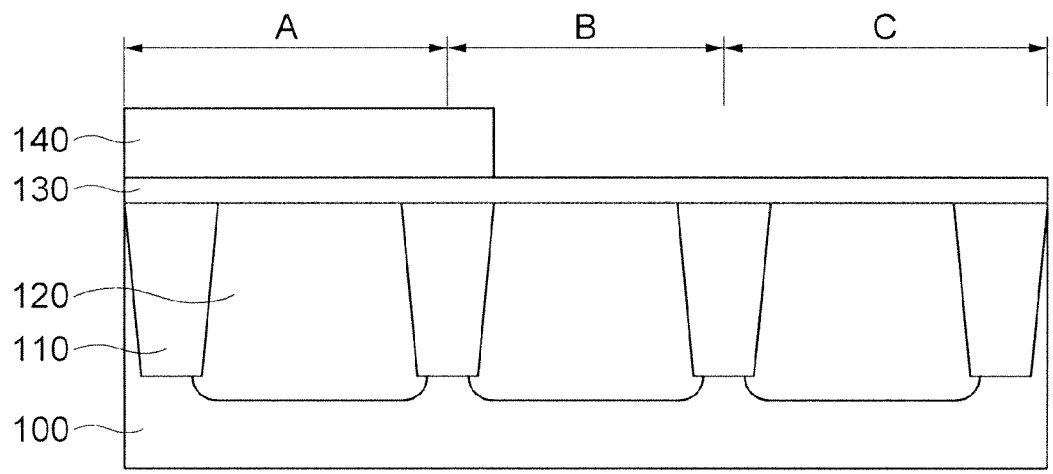

[Fig. 1c]
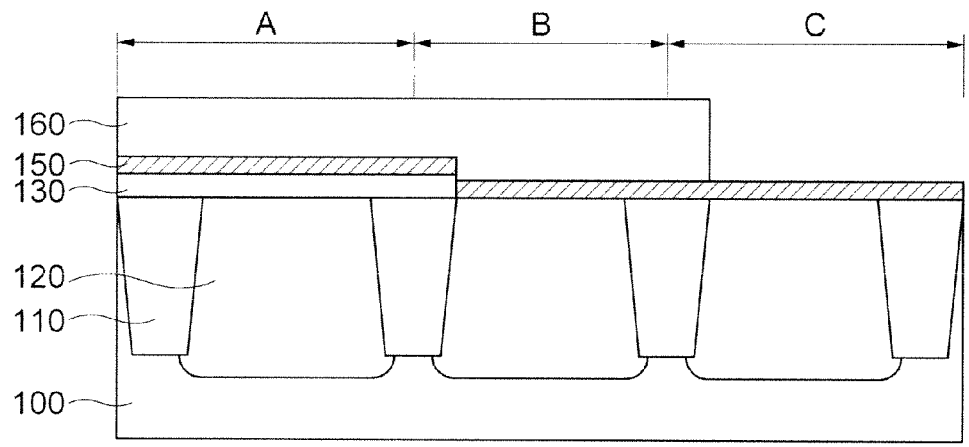
[Fig. 1d]
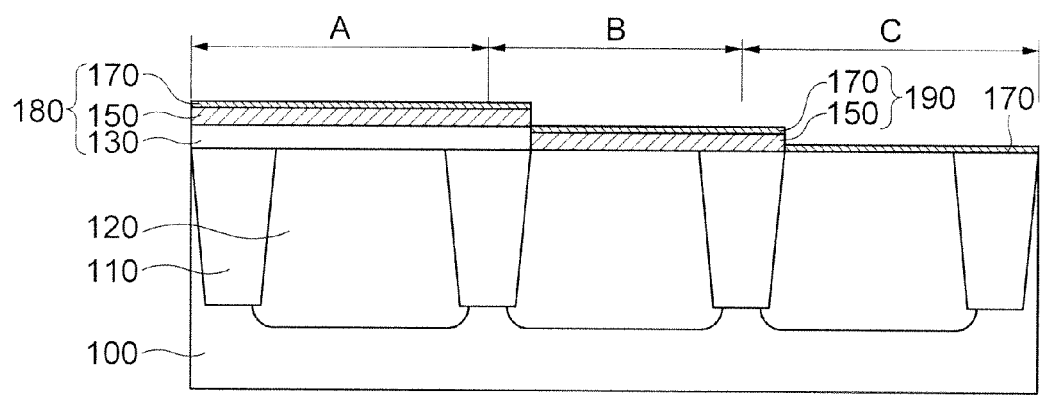
[Fig. 2a]
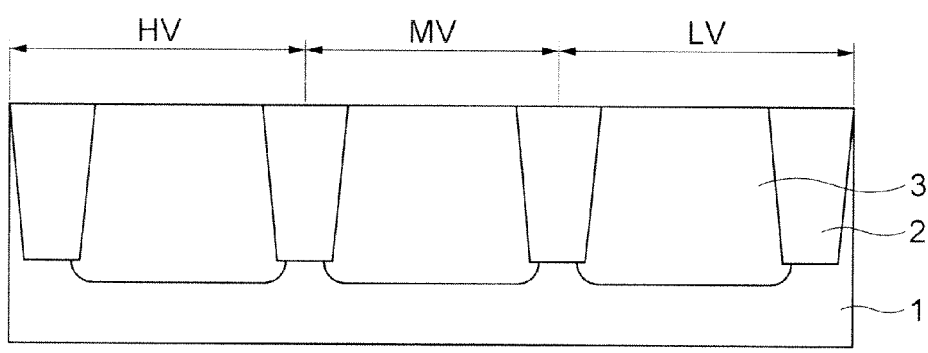

[Fig. 2b]
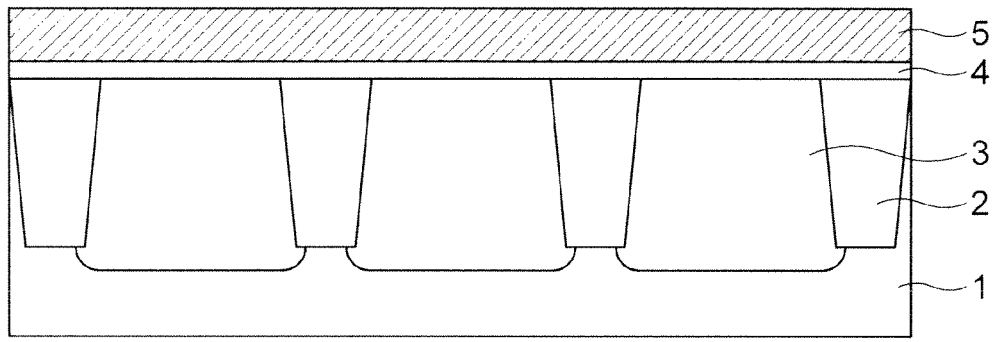
[Fig. 2c]
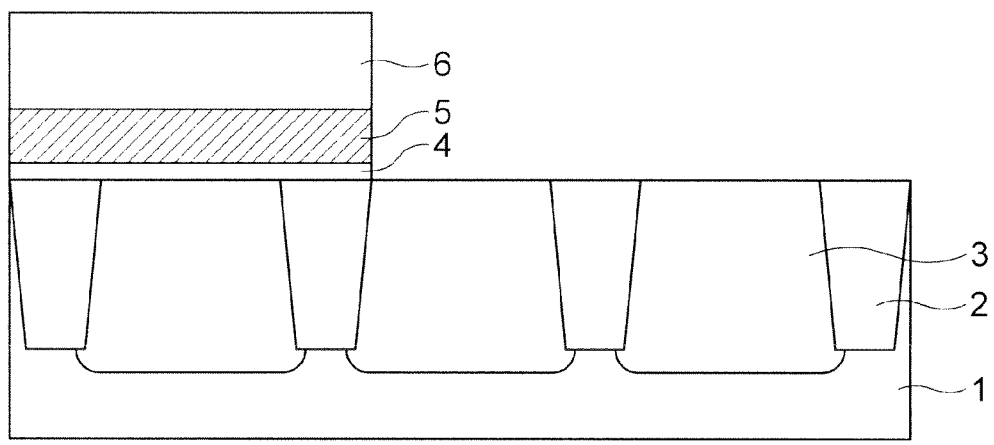
[Fig. 2d]
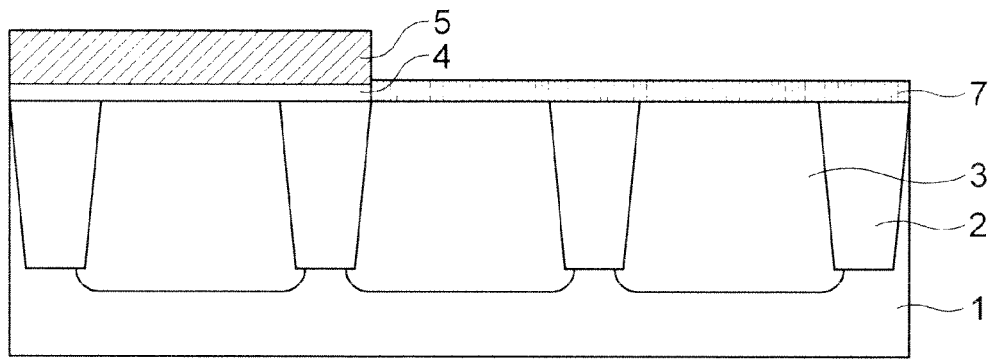

[Fig. 2e]
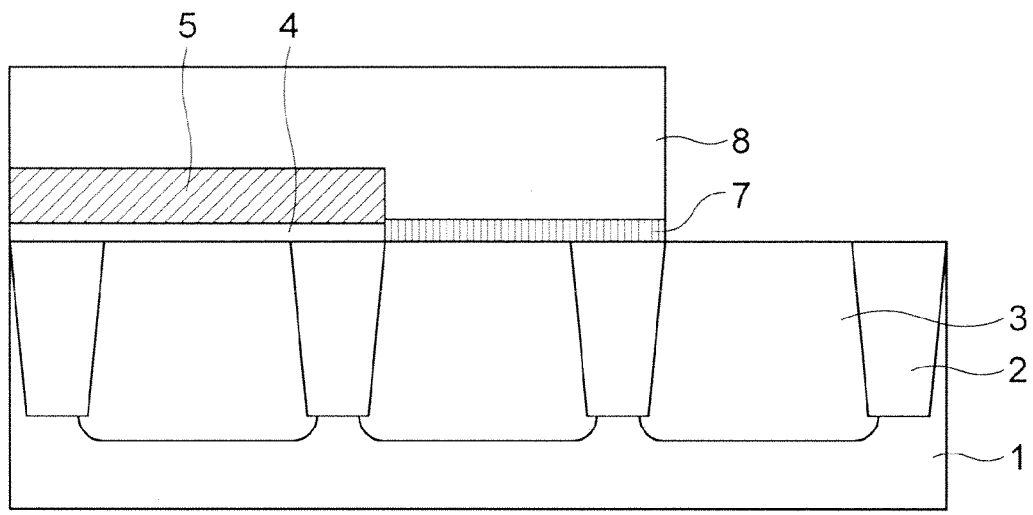
[Fig. 2f]
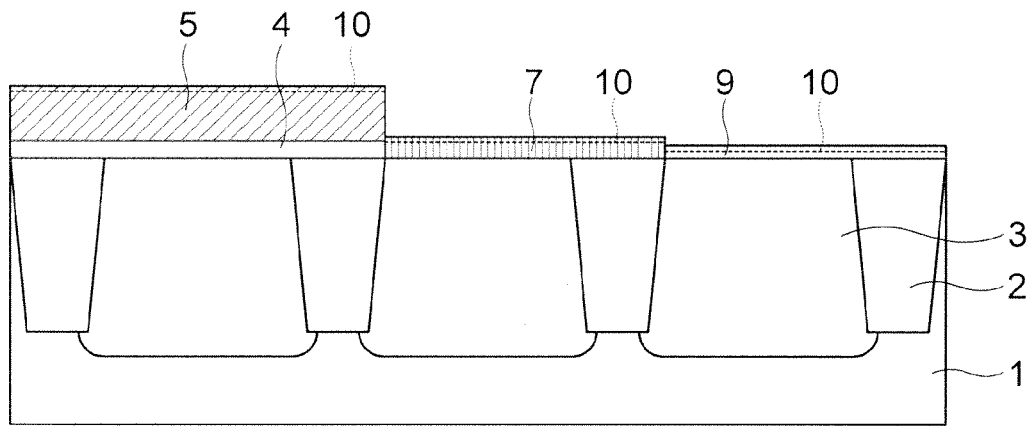

[Fig. 2g]
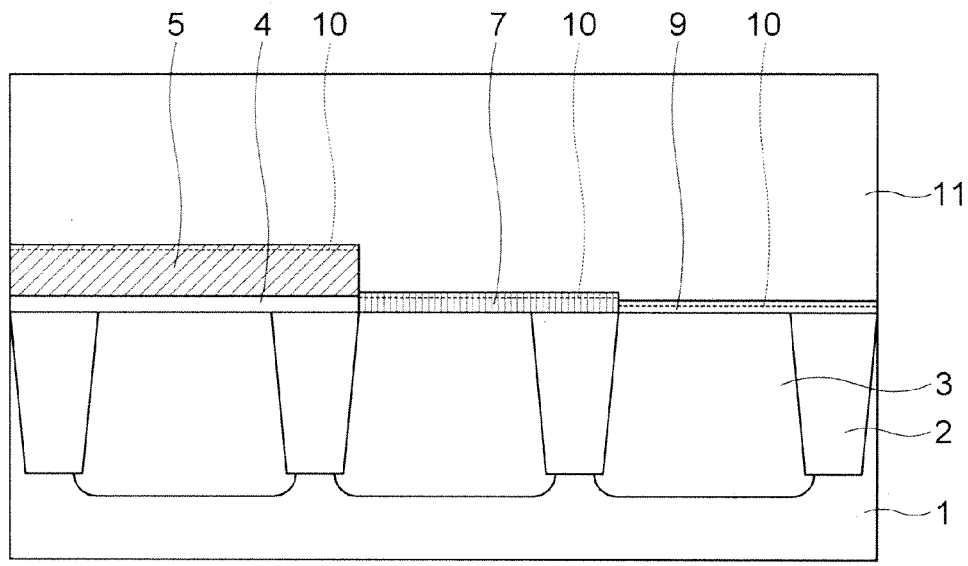
[Fig. 2h]
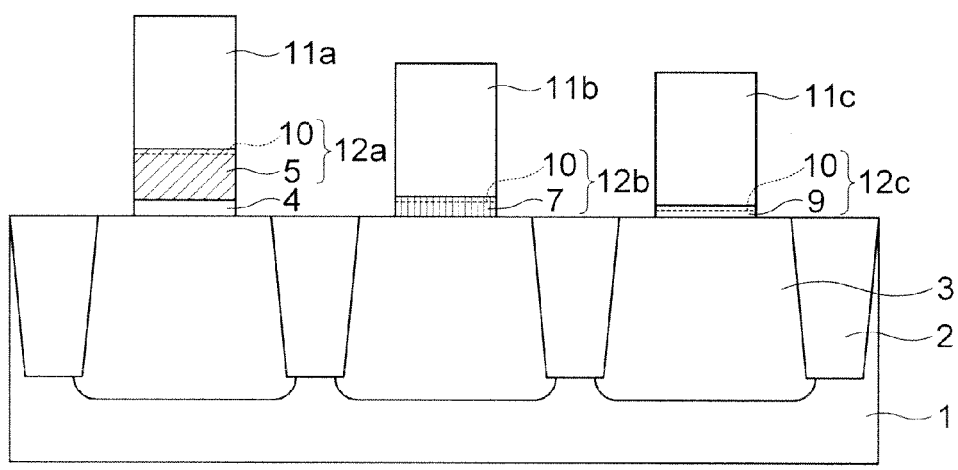

[Fig. 3]
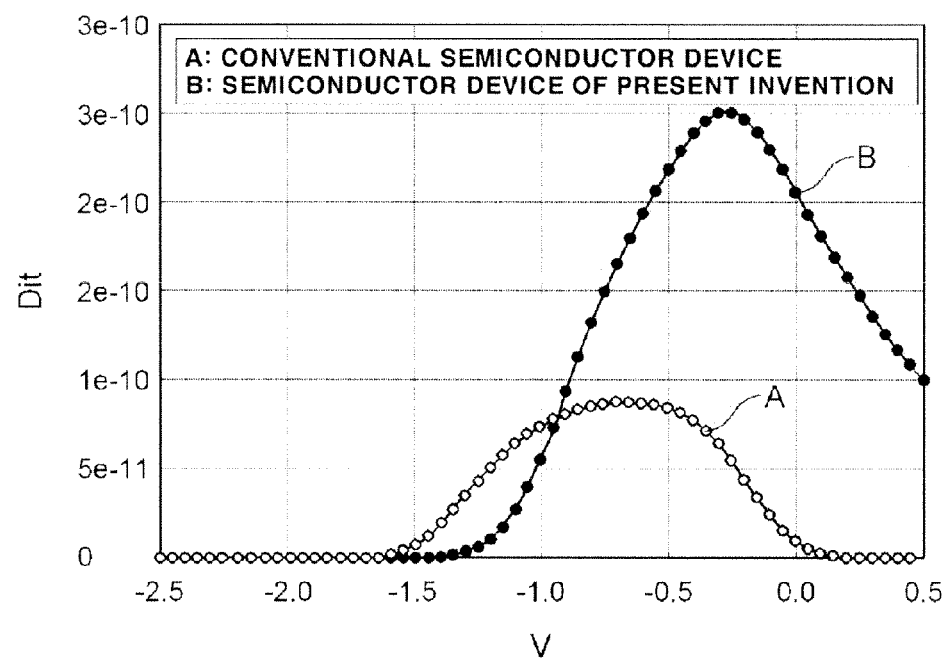

METHOD FOR FORMING GATE OXIDE OF SEMICONDUCTOR DEVICE

This application is a continuation application of application Ser. No. 12/318,392, filed on Dec. 29, 2008 now U.S. Pat. No. 7,892,960, which is based on and claims priority under 35 U.S.C. 119 from Korean Patent Application No. 10-2007-140369 filed Dec. 28, 2007, both of which are incorporated herein by reference in their entirety.

BACKGROUND OF THE INVENTION

1. Field of the Invention

The present invention relates to a method for forming a gate oxide of a semiconductor device, and more particularly, to a method for forming a gate oxide of a semiconductor device with a triple gate oxide having multiple thicknesses.

2. Background of the Related Art

Although conventional semiconductor memory devices have used a gate oxide film having a single thickness, system IC logic products use a semiconductor device having various operating voltages by using gate oxides having multiple thicknesses.

That is, the semiconductor device employs a triple gate oxide structure which includes a thick gate oxide formed in a high voltage region, a thin gate oxide formed in a low voltage region and a gate oxide thinner than the gate oxide formed in the high voltage region, thicker than the gate oxide formed in the lower voltage region and formed in a medium voltage region to achieve appropriate insulation.

FIGS. 1a, 1b, 1c and 1d are cross-sectional views illustrating a conventional method for forming a gate oxide of a semiconductor device.

Referring to FIG. 1a, an isolation layer 110 and wells 120 are formed in a semiconductor substrate 100 on which a first region A where a first gate oxide having a first thickness will be formed, a second region B where a second gate oxide having a second thickness less than the first thickness will be formed and a third region C where a third gate oxide having a third thickness less than the second thickness will be formed are defined.

Referring to FIG. 1b, a first oxide film 130 is formed of TEOS (Tetra Ethyl Ortho Silicate) by a predetermined thickness on the semiconductor substrate 100. A photoresist pattern 140 that selectively exposes the second region B and the third region C is formed on the first oxide film 130 and photolithography is performed using the photoresist pattern 140 as a mask to selectively remove a portion of the first oxide film 130, which is formed on the second region B and the third region C.

Referring to FIG. 1c, the photoresist pattern 140 is removed and a second oxide film 150 is formed by a predetermined thickness on the overall surface of the semiconductor substrate 100. Then, a photoresist pattern 160 that selectively exposes the third region C is formed on the second oxide film 150 and photolithography is performed using the photoresist pattern 160 as a mask to selectively remove a portion of the second oxide film 150, which is formed on the third region C, as illustrated in FIG. 1d.

Subsequently, a third oxide film 170 is formed by a predetermined thickness on the overall surface of the semiconductor substrate 100.

Accordingly, a first gate oxide 180 including the sequentially laminated first, second and third oxide films 130, 150 and 170 is formed in the first region A, a second gate oxide 190 including the sequentially laminated second and third oxide films 150 and 170 is formed in the second region B and a third gate oxide composed of the second oxide film 170 is formed in the third region C.

To form this triple gate oxide having multiple thicknesses, three masking processes and three deposition/etch processes are required, as described above. This increases the manufacturing cost and time and decreases production yield. Furthermore, it is difficult to secure a margin for a patterning process using photoresist as the integration of the semiconductor device increases.

Moreover, a cleaning process is required to selectively remove the oxide films to cause generation of a large number of particles on the surface of the semiconductor substrate.

Furthermore, in the case of the TEOS oxide film formed in the high voltage region A, dangling bonds or other point defects at the TEOS interface are not cured even though thermal budget is applied thereto, and thus a gate leakage current increases. In addition, deteriorated interface characteristic increases interface trap charge (Dit) density to decrease NBTI characteristic.

Moreover, when only the TEOS oxide film is formed thick, uniformity of the TEOS oxide film is decreased to degrade threshold voltage characteristic of a high voltage element formed in the high voltage region A so as to decrease electrical characteristic of the high voltage element.

SUMMARY OF THE INVENTION

Accordingly, the present invention has been made in view of the above-mentioned problems occurring in the prior art, and it is a primary object of the present invention to provide a method for forming a gate oxide of a semiconductor device, which forms a gate oxide having a triple structure of a wet oxide film/TEOS oxide film/plasma nitride film in a high voltage region of a high voltage element having a triple gate region and hardens the TOES oxide film of the high voltage region according to a high temperature when an oxide film is formed on a medium voltage region to improve uniformity of the TEOS oxide film and enhance electrical characteristic such as threshold voltage characteristic.

To accomplish the above object of the present invention, according to the present invention, there is provided a method for forming a gate oxide of a semiconductor device, which includes the steps of defining a first region where a gate oxide having a first thickness will be formed, a second region where a gate oxide having a second thickness will be formed and a third region where a gate oxide having a third thickness will be formed on a semiconductor substrate, forming a first oxide film through wet oxidation on the semiconductor substrate and forming a second oxide film on the first oxide film, blocking the first region and selectively removing portions the second oxide film and the first oxide film, which are formed on the second region and the third region, forming a third oxide film through thermal oxidation on the semiconductor substrate, blocking the first region and the second region and selectively removing a portion of the third oxide film, which is formed on the third region, and forming a fourth oxide film through thermal oxidation on the semiconductor substrate and then forming a nitride film thereon, wherein a gate oxide having a triple structure of the first oxide film/second oxide film/nitride film is formed in the first region, a gate oxide having a double structure of the third oxide film/nitride film is formed in the second region and a gate oxide having a double structure of the fourth oxide film/nitride film is formed in the third region.

The present invention can form a gate oxide having a triple structure of a wet oxide film/TEOS oxide film/nitride film in a high voltage region and harden the TEOS oxide film when a gate oxide of a medium voltage region is formed to improve characteristics and uniformity of the gate oxide.

Furthermore, the present invention can form a TEOS oxide film according to an operating voltage to improve an interface trap charge (Dit) level and threshold voltage characteristic so as to enhance the reliability of a semiconductor device employing the TEOS oxide film.

BRIEF DESCRIPTION OF THE DRAWINGS

The above and other objects, features and advantages of the present invention will be apparent from the following detailed description of the preferred embodiments of the invention in conjunction with the accompanying drawings, in which:

FIGS. 1a, 1b, 1c and 1d are cross-sectional views illustrating a conventional method for forming a gate oxide of a semiconductor device;

FIGS. 2a through 2h are cross-sectional views illustrating a method for forming a gate oxide of a semiconductor device according to an embodiment of the present invention; and FIG. 3 is a graph illustrating voltage-current characteristics of a semiconductor device having a gate oxide formed according to an embodiment of the present invention and a conventional semiconductor device.

DETAILED DESCRIPTION OF THE PREFERRED EMBODIMENT

FIGS. 2a through 2h are cross-sectional views illustrating a method for forming a gate oxide of a semiconductor device according to an embodiment of the present invention.

Referring to FIG. 2a, an isolation layer 2 is formed in a semiconductor substrate 1 to define a high voltage region HV, a medium voltage region MV and a low voltage region LV. Ion implantation is performed to respectively form wells 3 in the high voltage region HV, the medium voltage region MV and the low voltage region LV.

Referring to FIG. 2b, a first oxide film 4 is formed by a predetermined thickness on the overall surface of the semiconductor substrate 1 and a second oxide film 5 is formed thereon. Here, the first oxide film 4 is formed in order to improve interface trap charge (Dit) characteristic of Si/SiO2 interface.

The first oxide film 4 is formed of a wet oxide in the ambient of $H_2/O_2$ by a thickness in the range of 40 to 220 Å at a temperature in the range of 800 to 900° C. and the second oxide film 5 is formed of TEOS by a thickness in the range of 200 to 1100 Å through LP-CVD at a low temperature in the range of 600 to 650° C. according to an operating voltage of a high voltage element formed in the high voltage region HV.

Here, the thickness ratio of the first oxide film 4 to the second oxide film 5 is 1:20 in order to improve interface trap charge characteristic and optimize a time required to remove a gate oxide of the medium voltage region MV, which will be explained later.

Referring to FIG. 2c, a first photoresist pattern 6 that blocks the high voltage region HV is formed on the second oxide film 5 and an etch process using 1:20 buffered oxide etchant (BOE) is performed with the first photoresist pattern 6 as an etch mask to selectively remove portions of the second oxide film 5 and the first oxide film 4, which are formed on the medium voltage region MV and the low voltage region LV.

Referring to FIG. 2d, the first photoresist pattern 6 is stripped off and a third oxide film 7 is formed by a thickness in the range of 100 to 150 Å in the ambient of $H_2/O_2$ at a temperature in the range of 800 to 900° C.

Here, the second oxide film 5 formed of TEOS is hardened by heat generated when the third oxide film 7 is formed, and thus loss of the second oxide film 5 is reduced in a following wet cleaning process.

Referring to FIG. 2e, a second photoresist pattern 8 that blocks the high voltage region HV and the medium voltage region MV is formed and an etch process using 1:20 BOE is performed to expose a portion of the semiconductor substrate 1, which corresponds to the low voltage region LV.

Referring to FIG. 2f, the second photoresist pattern 8 is removed and a fourth oxide film 9 is formed by a thickness in the range of 15-20 Å in the ambient of $H_2/O_2$ at a temperature in the range of 650 to 700° C. and a nitride film 10 is formed on the overall surface of the semiconductor substrate 1.

Here, the nitride film 10 is formed by using remote plasma through plasma nitridation at a temperature in the range of 400 to 450° C.

Referring to FIG. 2g, a polysilicon film 11 is formed by a thickness in the range of 1600 to 1800 Å on the overall surface of the semiconductor substrate 1 and photolithography is performed to respectively form gate electrodes 11a, 11b and 11c in the high voltage region HV, the medium voltage region MV and the low voltage region LV, as illustrated in FIG. 2h.

Accordingly, a first gate oxide 12a including the first oxide film 4 formed of a wet oxide, the second oxide film 5 formed of TEOS and the nitride film 10, which are sequentially laminated, is formed in the high voltage region HV, a second gate oxide 12b including the sequentially laminated third oxide film 7 and the nitride film 10 is formed in the medium voltage region MV and a third gate oxide 12c including the sequentially laminated the fourth oxide film 9 and the nitride film 10 is formed in the low voltage region LV.

As described above, the present invention forms the stack structure of the wet oxide film and the TEOS oxide film as the gate oxide of the high voltage region HV and forms the thermal oxide film as the gate oxides of the medium voltage region MV and the low voltage region LV, and thus the TEOS oxide film of the high voltage region HV is hardened while the thermal oxide film is formed. Accordingly, loss of the TOES oxide film can be prevented in a following wet process.

Furthermore, the TEOS oxide film is formed on the wet oxide film having a predetermined thickness to improve uniformity of the TEOS oxide film so as to enhance threshold voltage characteristic of the high voltage element formed in the high voltage region HV.

FIG. 3 is a graph illustrating voltage-current characteristics of a semiconductor device B having the gate oxide formed according to an embodiment of the present invention and a conventional semiconductor device A.

Referring to FIG. 3, the conventional semiconductor device A has only a TEOS oxide that is heat-treated and the semiconductor device B of the present invention has a gate oxide including of a wet oxide film and a TEOS oxide film. The interface trap charge level of the semiconductor device B of the present invention is triple the interface trap charge level of the conventional semiconductor device A using only the TEOS oxide as a gate oxide.

Moreover, the gate oxide having a stack structure of the wet oxide film and the nitride film is formed even in the low voltage region LV, and thus boron infiltration from the high voltage element formed in the high voltage region HV can be prevented.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A gate oxide of a semiconductor device comprising:
   a semiconductor substrate divided into a first region, a second region, and a third region;
   a first gate oxide layer formed in a triple structure of a first silicon oxide film/second silicon oxide film/nitride film on the first region;
   a second gate oxide layer formed in a double structure of a third oxide film/nitride film on the second region; and
   a third gate oxide layer formed in a double structure of a fourth oxide film/nitride film on the third region.

2. The gate oxide of a semiconductor device of claim 1, wherein the thickness ratio of the first silicon oxide film to the second silicon oxide film is 1:20.

3. The gate oxide of a semiconductor device of claim 2, wherein the first silicon oxide film is formed by a thickness in the range of 40 to 220Å and the second silicon oxide film is formed by a thickness in the range of 200 to 1100Å.

4. The gate oxide of a semiconductor device of claim 1, wherein the first silicon oxide film is formed in the ambient of $H_2/O_2$ at a temperature in the range of 800 to 900° C. through wet oxidation.

5. The gate oxide of a semiconductor device of claim 1, wherein the second silicon oxide film corresponds to a TEOS oxide formed through LP-CVD.

6. The gate oxide of a semiconductor device of claim 1, wherein the second silicon oxide film is formed at a low temperature in the range of 600 to 650° C.

7. The gate oxide of a semiconductor device of claim 1, wherein the third oxide film is formed by a thickness in the range of 100 to 150Å.

8. The gate oxide of a semiconductor device of claim 1, wherein the third oxide film is formed in the ambient of $H_2/O_2$ at a high temperature in the range of 800 to 900° C. such that the second silicon oxide film is heat-treated to be hardened while the third oxide film is formed.

9. The gate oxide of a semiconductor device of claim 1, wherein the fourth oxide film is formed by a thickness in the range of 15 to 20Å on the third region in the ambient of $H_2/O_2$ at a temperature in the range of 650 to 700° C.

10. The gate oxide of a semiconductor device of claim 1, wherein the nitride film is formed through plasma nitridation.

11. The gate oxide of a semiconductor device of claim 10, wherein the plasma nitridation is performed at a temperature in the range of 400 to 450° C. using remote plasma.

12. The gate oxide semiconductor device of claim 1, wherein the first gate oxide layer is spaced apart from the second gate oxide layer.

13. The gate oxide semiconductor device of claim 1, wherein the second gate oxide layer is spaced apart from the third gate oxide layer.

14. The gate oxide semiconductor device of claim 1, wherein the semiconductor substrate comprises a first isolation layer disposed between the first region and the second region, and a second isolation layer disposed between the second region and the third region.

* * * * *